(12) United States Patent
Kothandaraman

(10) Patent No.: US 7,029,955 B2
(45) Date of Patent: Apr. 18, 2006

(54) OPTICALLY AND ELECTRICALLY PROGRAMMABLE SILICIDED POLYSILICON FUSE DEVICE

(75) Inventor: Chandrasekharan Kothandaraman, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 10/669,026

(22) Filed: Sep. 23, 2003

(65) Prior Publication Data

US 2004/0056325 A1    Mar. 25, 2004

Related U.S. Application Data

(63) Continuation of application No. 09/921,136, filed on Aug. 3, 2001, now abandoned.

(51) Int. Cl.
H01L 21/82    (2006.01)
(52) U.S. Cl. ..................................... 438/132
(58) Field of Classification Search ............... 438/131, 438/132, 601, 648, 215, 281, 647, 680, 200, 438/14; 257/529, 530, 50
See application file for complete search history.

(56) References Cited

U.S. PATENT DOCUMENTS

| | | |
|---|---|---|
| 4,518,981 A | 5/1985 | Schlupp |
| 4,814,853 A | 3/1989 | Uchida |
| 5,266,829 A | 11/1993 | Hamdy et al. |
| 5,536,968 A | 7/1996 | Crafts et al. |
| 5,585,662 A | 12/1996 | Ogawa |
| 5,585,663 A | 12/1996 | Bezama et al. |
| 5,708,291 A | 1/1998 | Bohr et al. |
| 5,882,998 A * | 3/1999 | Sur et al. .................... 438/601 |
| 5,969,404 A | 10/1999 | Bohr et al. |
| 5,976,943 A | 11/1999 | Manley et al. |
| 6,104,079 A | 8/2000 | Stamper |
| 6,166,421 A | 12/2000 | Kalnitsky et al. |
| 6,222,244 B1 | 4/2001 | Arndt et al. |
| 6,300,252 B1 | 10/2001 | Ying et al. |
| 6,368,902 B1 | 4/2002 | Kothandaraman et al. |
| 6,399,472 B1 * | 6/2002 | Suzuki et al. ............... 438/601 |
| 6,420,217 B1 | 7/2002 | Kalnitsky et al. |
| 6,436,738 B1 | 8/2002 | Yu |
| 6,440,834 B1 | 8/2002 | Daubenspeck et al. |

FOREIGN PATENT DOCUMENTS

EP         0 999 592 A1    5/2000

* cited by examiner

*Primary Examiner*—David Blum
*Assistant Examiner*—Monica D. Harrison
(74) *Attorney, Agent, or Firm*—Slater & Matsil, L.L.P.

(57) ABSTRACT

A silicided polysilicon based fuse device that is programmable by optical and electrical energy in the polysilicon layer without damage to nearby structures, comprising:
  a Si substrate;
  an insulating layer disposed on the substrate; and
a fuse device section comprising poly-Si/a silicide/ and a barrier layer, the fuse device section forming an electrical discontinuity in the poly Si layer in response to an electrical pulse or an optical pulse applied to it.

17 Claims, 5 Drawing Sheets

OPTICALLY AND ELECTRICALLY PROGRAMMABLE SILICIDED POLYSILICON FUSE DEVICE

This invention is a continuation of Ser. No. 09/921,136, filed Aug. 3, 2001, now abandoned.

BACKGROUND OF THE INVENTION

1. Field of Invention

The invention relates to integrated circuit devices, and more particularly, to fusible link devices in semiconductor integrated circuits in which the laser fuse is made in the poly-Si level, as opposed to the metal level, which can be placed in oxide.

2. The Prior Art

In general, today, integrated circuits are made with internal connections that are set during manufacturing; however, due to high development costs, lengthy lead times, and the high tooling costs of these circuits, the end user prefers circuits which can be programmed in the field. These circuits are typically referred to as programmable circuits since they usually contain programmable links.

Programmable links are electrical interconnects which are broken or created at selected electronic nodes by the end user after the integrated circuit device has been fabricated in order to activate or deactivate the selected electronic nodes.

As a case in point, programmable links are used widely in programmable read-only memory devices (PROMs). In this connection, it is pointed out that the most common form of programmable link is the fusible link. Upon obtaining a PROM device, typically it will consist of an X-Y lattice of conductors or semiconductors. The lattice comprises a cross-over point of a conducting link, which is referred to as a fusible link, that connects a transistor to this lattice network. To program the PROM, the fusible link is blown at selected nodes to create an open circuit. The combination of blown and unblown links constitutes a digital bit pattern of ones and zeros that constitute data which the user stores in the PROM.

Some of the key disadvantages of fusible link PROM systems is that, because of the nature of the conducting material in the link, high voltage and high current levels are usually needed during programming in order to complete blowing of the fusible link. Because the link is relatively high in conductance, it requires a considerable amount of power dissipation to blow it. Further, the size and shape of the fusible link must be exacting so that the link will function effectively as a conductor if it is not blown and be a completely open circuit if it is blown.

A second type of programmable link has also been utilized frequently. The second type of programmable link is referred to as an anti-fuse link, and enjoys considerable use in integrated circuit applications. In the anti-fuse link, instead of the programming mechanism causing an open circuit as is the case with fusible links, the programming mechanism creates a short circuit or low resistance link. The anti-fuse link consists of two conductor and/or semiconductor materials with a dielectric or insulating material between them. During programming, the insulating or dielectric material at selected points in between the conductive material is broken down by a predetermined applied voltage to electrically connect the conducting or semiconducting materials together.

A silicide agglomeration fuse device is disclosed in U.S. Pat. No. 5,708,291. The fusible link device is disposed on a semiconductor substrate and comprises:

a polysilicon layer having a first resistance;

a silicide layer formed on the polysilicon layer, the silicide layer having a second resistance lower than the first resistance, the silicide layer agglomerating to form an electrical discontinuity in response to a predetermined programming potential being applied across the silicide layer, such that the resistance of the fusible link device can be selectively increased and;

nine contacts electrically coupled to either end of the silicide layer for receiving the programming potential.

U.S. Pat. No. 5,969,404 disclose a fusible link device on a semiconductor substrate for providing discretionary electrical connections. The fusible link device has a first unprogrammed resistance and includes a polysilicon layer and a silicide layer. The silicide layer is formed on the polysilicon layer, and agglomerates to form an electrical discontinuity in response to a predetermined programming potential being applied across the silicide layer, such that the resistance of the fusible link device can be selectively increased to a second programmed resistance.

A polysilicon fuse array structure for integrated circuits is disclosed in U.S. Pat. No. 5,536,968. The semiconductor structure comprises:

a first electrical conductor;

a second electrical conductor electrically separated from the first electrical conductor;

a polysilicon strip connecting the first and second electrical conductors and forming a fuse between the first and second electrical conductors, the polysilicon strip including a narrow middle section, whereby the fuse will be opened by a current which is passed from the first electrical conductor through the polysilicon strip into the second electrical conductor;

a first patterned signal layer, the first electrical conductor and the polysilicon strip residing in the first patterned signal layer; and a second patterned signal layer electrically separated from the first patterned signal layer, the second electrical conductor residing in the second patterned signal layer.

U.S. Pat. No. 6,104,079 disclose closely pitched polysilicon fuses and a method for making the same. In the method for decreasing the pitch of polysilicon fuses tungsten barriers are formed adjacent to the fuse elements and the tungsten barriers are made compatible with the process to form a crack stop. The tungsten is stacked at the via level on top of the tungsten at the contact level in the crack stop, and the interlevel dielectric is used as a cover for the fuse. In this way, the tungsten fuse barrier process is made compatible with the polysilicon fuse crack stop process.

An electrically global fuse in a reduced co-sectional area is disclosed in U.S. Pat. No. 6,222,244 B1. The semiconductor fuse is positioned between conductors for connecting at least two wiring lines. The fuse comprises spacers positioned on adjacent one's of the conductors, and the fuse element is positioned between the spacers and connected to the wiring lines. A space between the conductors comprises the first width comprising a smallest possible photolithographic width and the fuse element has a second width smaller than the first width. This fuse protects the semiconductor device from excessive voltage and/or current or selectively and permanently connect/disconnect semiconductor devices from one another.

U.S. Pat. No. 5,266,829 disclose an electrically programmable low-impedance, anti-fuse element. It consists of a capacitor-like structure having a first electrode and a second electrode with a dielectric layer in between, characterized by a high impedance and very low leakage current before programming and a low-resistance after programming. A plurality of these anti-fuses is disposed in a semiconductor integrated circuit, and maybe selectively blown to create low impedance interconnects at selected locations within the integrated circuit. The anti-fuses may be blown either before or after packaging of the integrated circuit die.

U.S. Pat. No. 5,882,998 disclose a low power programmable fuse structure and method of making the same.

The method comprises:

providing a substrate having a filed oxide region;

forming a mask over the doped polysilicon strip such that a window exposing the doped polysilicon strip is defined at about the center of the doped polysilicon strip;

applying an increased implant dose over the mask and the exposed doped polysilicon strip lying within the window to produce an increased dopant concentration region in the doped polysilicon strip, the increased implant dose being between about $3.10^{15}$ cm$^{-2}$ and about $6\times10^{15}$ atoms cm$^{-2}$; and forming a silicide metal over the doped polysilicon strip such that a thinner layer of the silicide metal is formed over the increased dopant concentration region and a thicker layer of the silicide metal is formed over other regions of the doped polysilicon strip.

There is a need in the art of utilizing programmable fuses in integrated circuits to reduce the damage to SILK by other than the current method of using fuses in the final metal level which may be placed in oxide, and wherein some damage to the structure still results.

There is a further need in the art of providing programmable fuse links for use in integrated circuits to alleviate physical damage to the structure, as is typically the case when the fuses are electrically programmed.

There is a further need in the art of providing programmable fuses for use in integrated circuits to be able to utilize less energy when compared to ablation or melting, and to reduce the pitch and damage to nearby structures.

Finally, there is a need in the art of providing programmable fuses for use in integrated circuits to eliminate refractory metals that are normally needed as liners for poly-Si lines, to be able to use shorter wavelengths, and thereby tighter focal spots that lead to reduced pitch, but which also lends itself to being electrically programmed (and thereby provide the improved flexibility of affecting programming with either optical energy or electrical energy).

SUMMARY OF THE INVENTION

One object of the present invention is to provide programmable fuses in integrated circuits that reduce the damage to interlevel dielectrics and neighboring structures by avoiding using fuses in the final metal level (which may be placed in oxide), and where some damage to the structure still occurs.

Another object of the present invention is to provide programmable fuse links for use in integrated circuits that, unlike all currently known methods of programming, are free from physical damage to the structure.

A further object of the present invention is to provide programmable fuses for use in integrated circuits that utilize less energy in comparison to ablation or melting techniques, and that reduces the pitch and damage to nearby structures upon programming.

A yet further object of the present invention is to provide programmable fuses for use in integrated circuits that are capable of being programmed by optical means, of shorter wavelengths, and thereby reducing the focal spot size of the itself to being electrically programmed as well as optically optical beam that lead to reduced pitch, but which also lends programmed.

BRIEF DESCRIPTION OF THE DRAWING FIGURES

DETAILED DESCRIPTION OF PREFERRED EMBODIMENT OF THE INVENTION

Figure 1:
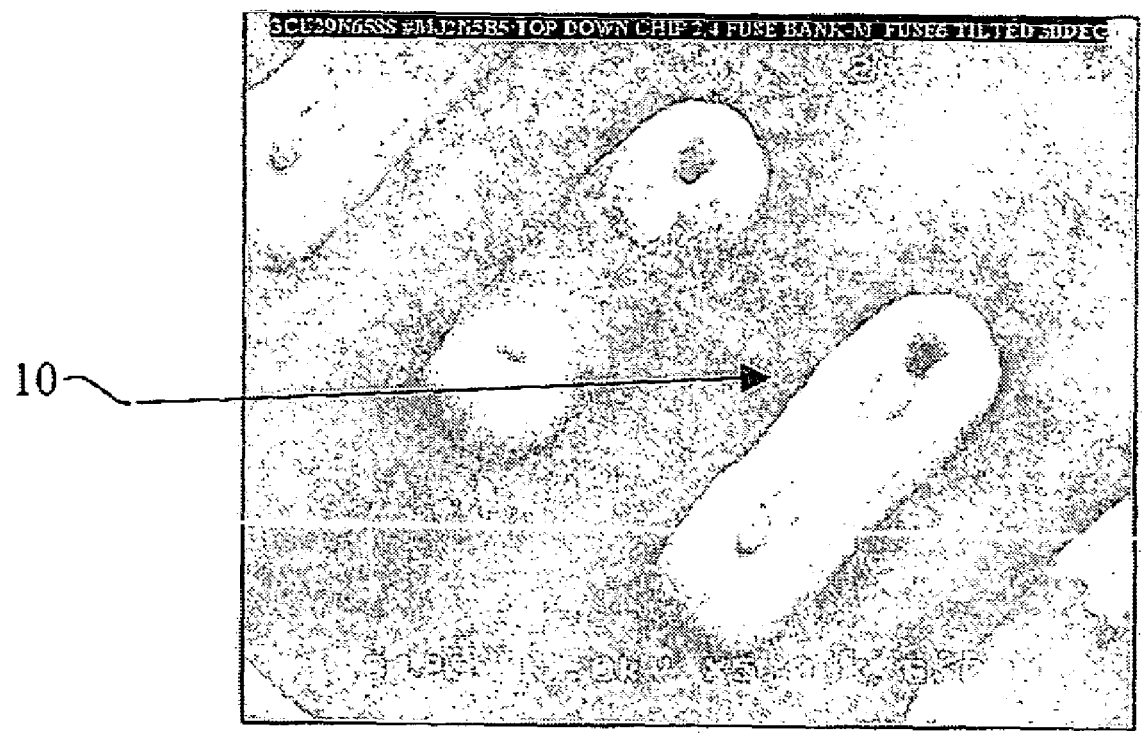
FIG. 1 is a microphotograph of a fuse link of the prior art in which there are metal lines on oxide/low dielectric constant materials, and in which there is a splatter.

Reference is now made to FIG. 1 which shows a microphotograph of a fuse link, wherein metal lines on oxide/low dielectric constant materials evidence a splatter formed by the high energy needed to program this fuse. When programming similar fuse links found in the prior art, a large pitch is needed and this is another disadvantage attendant to the use of this fuse link. Further disadvantages associated with the large pitch that is needed for programming in the prior art fuse link is the damage caused to the layers beneath the fuse, and that the fuses are isolated in a fuse box (and this causes an area penalty). Additionally, there are complications in back-end integration—such as flip chip bonding—when utilizing this prior art poly-Si based fuse link.

Figure 2:
FIG. 2 is a microphotograph of a fuse link of the prior art in which there is a metal line on oxide/low-dielectric constant materials, and in which there is a crack.

A still further disadvantage in addition to the splatter created from high energy when programming the prior art fuse link is that cracks 11 are created upon programming, as can be seen in the microphotograph of FIG. 2.

Figure 3:
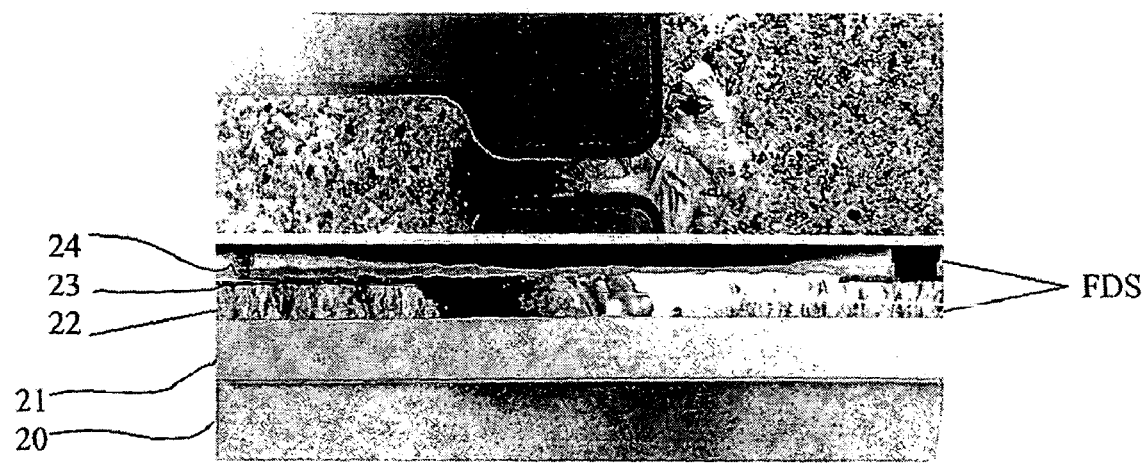
FIG. 3 is a microphotograph of the silicided polysilicon based fuse of the invention after programming.

The invention silicided polysilicon based fuse device that may be programmed either optically or electrically is shown in FIG. 3. In this figure, which comprises a top view as well as a cross sectional side view of the silicided polysilicon based fuse device, there is a silicon substrate 20 with an insulating layer 21 disposed above. In this embodiment of the fuse device, the fuse device section FDS is disposed on the insulating layer 21, as a part of a larger integrated circuit device. The polysilicon layer 22 may be doped p-type; however, other embodiments or configurations may include other types of doping including n-type or the formation of p-n junctions in the polysilicon layer 22. The fuse device section FDS includes a Cobalt silicide (CoSi$_2$) layer 23 disposed on the polysilicon layer 22, and a transparent passivation layer 24 on the CoSi$_2$ layer 23. In operation, the fuse device section FDS is characterized by a resistance in the silicided polysilicon before it is programmed or blown. As may be seen from FIG. 3, in the programmed state, the higher resistance is obtained because of the removal of the CoSi$_2$ in some regions. It is apparent that the fuse link has not been physically ruptured in order to achieve this higher resistance state. Furthermore, the passivation layer 24 is unperturbed during the entire process.

It is believed that any dopants in the polysilicon that may contribute to any residual conduction have also rendered inactive due to programming. The SiN layer functions as an encapsulation or barrier layer, which while allowing the transmission of optical energy, allows for the change in the resistance of the silicided polysilicon layer without rupturing this layer.

In the context of the invention, while $CoSi_2$ is preferred as the silicide, other silicides such as titanium, tungsten, or platinum silicides are equally operable. Also, in the context of the invention the SiN is the preferred encapsultation layer; however, any transparent, encapsulation or barrier layer will suffice.

Figure 4:
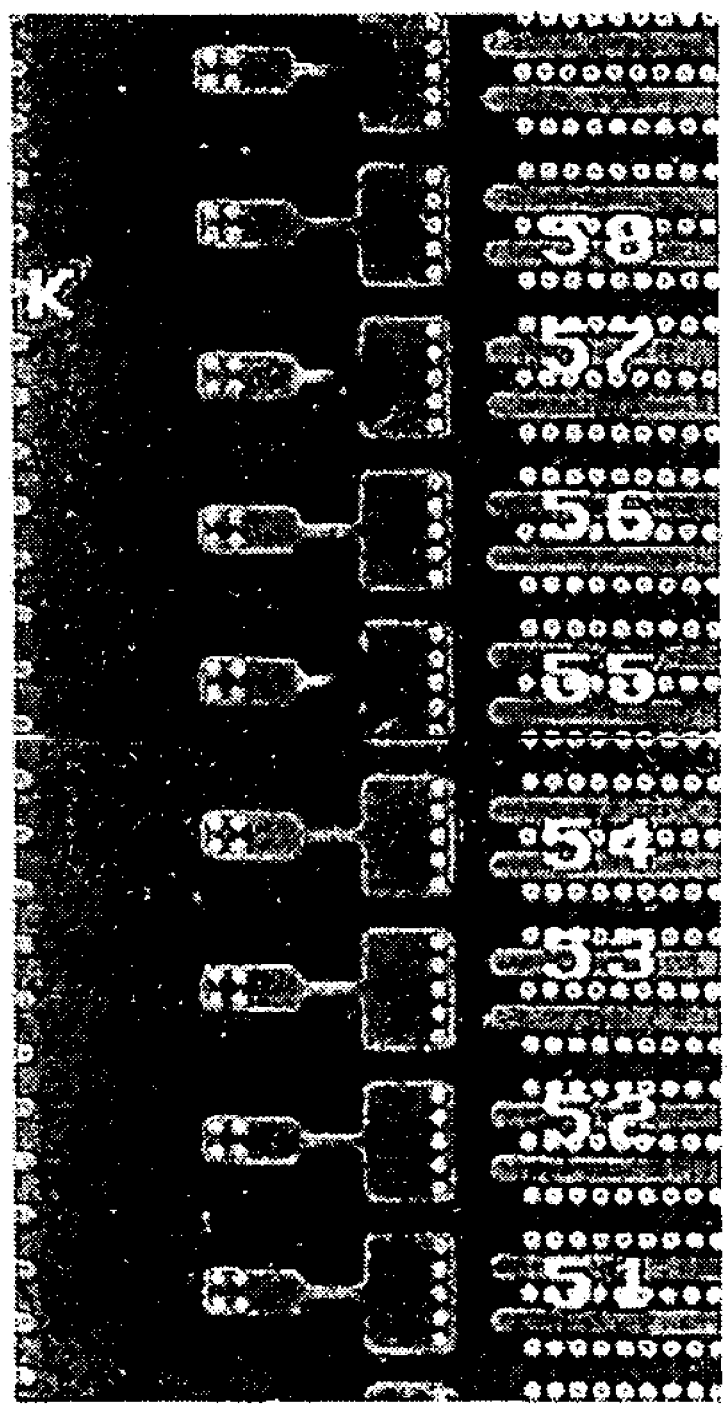
FIG. 4 shows a top view of a microphotograph of a fusible link device of the present invention comprising a large array structure of an eFuse bank in which silicided poly-Si lines are programmed by a thick-oxide.
Figure 5:
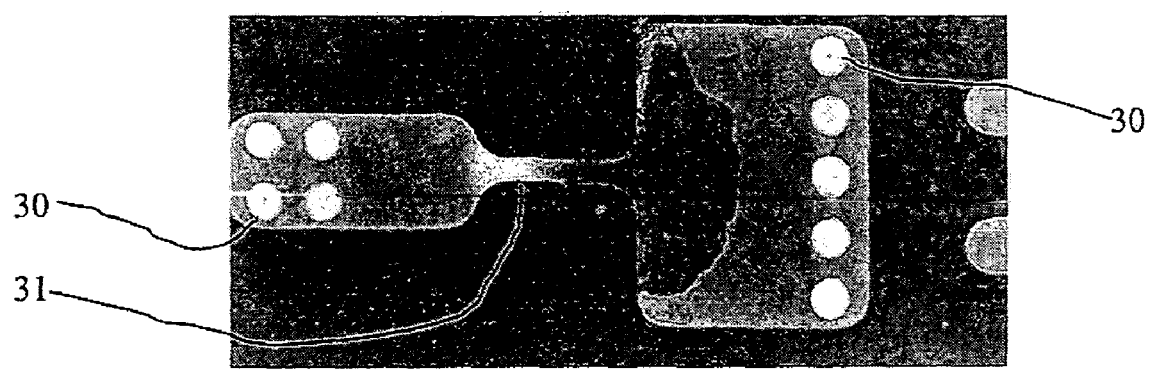
FIG. 5 shows a top view of a microphotograph of a single fusible link device of the present invention comprising an eFuse in which silicided Poly-Si lines are programmed by a thick-oxide.

FIG. 4 shows a microphotograph of the present invention structure comprising a large array of fuse links, showing silicided poly-Si links that are programmed. Preferably, the programming in this embodiment is done at about 3.3V and about 10 mA for about 200 microseconds, whereupon current is caused to flow between contacts 30 as shown in FIG. 5. The current flows through the fuse link to affect a change in the resistance of the fuse link, without rupturing the link 31. In other words, the basic resistivity fuse link is changed. The silicided polysilicon based fuse device of the invention may be programmed by the application of optical energy in the visible and NIR (near infrared) range realizing the increased local resistivity, again without any rupture. Further, there is no absorption in the inter-level dielectrics, oxide and nitride.

The novel inventive structure removes the disadvantages of metal-link laser fuses, provides flexibility in product choice and test flow, and allows programming by either laser or electrical means, and in so doing, induces a large resistance change in excess of $10^5$ Ohms, without rupture of the link.

I claim:

1. A method of programming selected ones of a multiplicity of fuse devices comprising the steps of:
   providing said multiplicity of programmable fuse devices having a first resistance, each of said multiplicity including a section comprising a combination of a poly silicon layer covered by a suicide layer, and a barrier layer covering said combination, said barrier layer suitable for transmitting an optical beam therethrough;
   directing an optical beam through said barrier layer and onto said silicide layer of at least one of said multiplicity of programmable fuse devices; and
   programming said at least one programmable fuse device without rupturing said combination by increasing the resistance of said at least one programmable fuse device from said first resistance to a second resistance in response to said optical beam being directed onto said silicide layer, wherein said optical beam is in the visual range.

2. The method of claim 1 wherein said barrier layer is SiN.

3. The method of claim 1 wherein said silicide is selected from the group consisting of cobalt silicide, titanium silicide, tantalum silicide and platinum silicide.

4. The method of claim 1, wherein said silicide is cobalt silicide.

5. The method of claim 1 wherein increasing the resistance of said at least one programmable fuse device comprises the step of removing a portion of said silicide layer.

6. The method of claim 1 further comprising programming selected ones of said multiplicity of fuse devices by passing a current through said combination of a poly silicon layer and a silicide layer.

7. The method of claim 6 wherein said step of passing a current comprises the step of providing a current of about 10 mA for about 200 microseconds.

8. The method of claim 7 wherein said current is generated by connecting a voltage of about 3.3V across said combination.

9. A method of programming selected ones of a multiplicity of fuse devices comprising the steps of:
   providing said multiplicity of programmable fuse devices having a first resistance, each of said multiplicity including a section comprising a combination of a poly silicon layer covered by a suicide layer, and a barrier layer covering said combination, said barrier layer suitable for transmitting an optical beam therethrough;
   directing an optical beam through said barrier layer and onto said silicide layer of at least one of said multiplicity of programmable fuse devices; and
   programming said at least one programmable fuse device without rupturing said combination by increasing the resistance of said at least one programmable fuse device from said first resistance to a second resistance in response to said optical beam being directed onto said silicide layer, wherein said optical beam is in the NIR (near infrared) range.

10. The method of claim 9, wherein said barrier layer is SiN.

11. The method of claim 9, wherein said suicide is selected from the group consisting of cobalt silicide, titanium silicide, tantalum silicide and platinum silicide.

12. The method of claim 9, wherein said silicide is cobalt silicide.

13. The method of claim 9, wherein increasing the resistance of said at least one programmable fuse device comprises the step of removing a portion of said silicide layer.

14. The method of claim 9, wherein said optical beam is in the visual range.

15. The method of claim 9, further comprising programming selected ones of said multiplicity of fuse devices by passing a current through said combination of a poly silicon layer and a silicide layer.

16. The method of claim 15 wherein said step of passing a current comprises the step of providing a current of about 10 mA for about 200 microseconds.

17. The method of claim 16 wherein said current is generated by connecting a voltage of about 3.3V across said combination.

* * * * *

UNITED STATES PATENT AND TRADEMARK OFFICE
CERTIFICATE OF CORRECTION

PATENT NO.       : 7,029,955 B2  
APPLICATION NO.  : 10/669026  
DATED            : April 18, 2006  
INVENTOR(S)      : Kothandaraman Page 1 of 1

It is certified that error appears in the above-identified patent and that said Letters Patent is hereby corrected as shown below:

Column 5, line 43: delete "suicide" and insert --silicide--.  
Column 6, line 22: delete "suicide" and insert --silicide--.  
Column 6, line 37: delete "suicide" and insert --silicide--.

Signed and Sealed this

Twenty-second Day of August, 2006

JON W. DUDAS  
*Director of the United States Patent and Trademark Office*